(12) United States Patent
Purser et al.

(10) Patent No.: US 8,884,244 B1
(45) Date of Patent: Nov. 11, 2014

(54) DUAL MODE ION IMPLANTER

(71) Applicant: Varian Semiconductor Equipment Associates, Inc., Gloucester, MA (US)

(72) Inventors: Kenneth H. Purser, Gloucester, MA (US); Christopher Campbell, Newburyport, MA (US); Frank Sinclair, Boston, MA (US); Robert C. Lindberg, Rockport, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/163,814

(22) Filed: Jan. 24, 2014

Related U.S. Application Data

(60) Provisional application No. 61/894,060, filed on Oct. 22, 2013.

(51) Int. Cl.
*H01J 37/00* (2006.01)
*H01J 37/317* (2006.01)
*H01J 37/147* (2006.01)

(52) U.S. Cl.
CPC ......... *H01J 37/1472* (2013.01); *H01J 37/3171* (2013.01)
USPC ................. 250/396 R; 250/492.1; 250/492.2; 250/492.3

(58) Field of Classification Search
CPC ................... H01J 37/3171; H01J 2237/24542; H01J 37/09; H01J 2237/0458; H01J 2237/15; H01J 2237/151; H01J 2237/0835; H01J 2237/083; H01J 2237/0455; G21K 5/04
USPC ............................... 250/396 R, 492.1–492.3
See application file for complete search history.

(56) References Cited

U.S. PATENT DOCUMENTS

| | | | |
|---|---|---|---|
| 5,350,926 A * | 9/1994 | White et al. | 250/492.21 |
| 2006/0258128 A1* | 11/2006 | Nunan et al. | 438/510 |
| 2011/0155929 A1* | 6/2011 | Bassom et al. | 250/492.21 |
| 2012/0056107 A1* | 3/2012 | Distaso et al. | 250/492.3 |
| 2012/0056110 A1* | 3/2012 | Distaso et al. | 250/492.21 |
| 2013/0130484 A1* | 5/2013 | Wan et al. | 438/514 |

* cited by examiner

*Primary Examiner* — Michael Maskell

(57) ABSTRACT

A system for dual mode operation in an ion implanter may include a movable beam blocker to adjust beam width of an ion beam in a first direction perpendicular to a first local direction of propagation of the ion beam. The system may further include a scanner to scan the ion beam in a second direction perpendicular to a second local direction of propagation of the ion beam when in a first state and to transmit the ion beam unperturbed in a second state; and mode selector to send a set of signals to the movable beam blocker and to the scanner in order to adjust the width of the ion beam and state of the scanner in concert.

13 Claims, 4 Drawing Sheets

DUAL MODE ION IMPLANTER

RELATED APPLICATIONS

This application claims priority to U.S. Provisional Patent Application Ser. No. 61/894,060, filed Oct. 22, 2013.

FIELD

The present embodiments relate to ion implantation, and more particularly, to ribbon beam ion implantation systems.

BACKGROUND

In the present day, ion implanters are often constructed to optimize implantation according to a specific set of applications. In current applications, for example, some beamline ion implanters are configured to generate high current ribbon beams in which the beam cross section that intercepts a substrate is defined by a beam width that is much greater than the beam height. In some configurations the beam width is slightly larger than the size of a substrate at the substrate plane e.g., 200, 300, or 400 mm, while the beam height is on the order of 10 mm, 20 mm, or 30 mm. By scanning the substrate with respect to the ribbon beam in the direction of the beam height, the entire substrate may be implanted by the ion beam. Various components of the beamline of a high current ribbon beam ion implanter are set to tailor operation for a ribbon beam, including ion source, scanning components, focusing components, and collimation components. In this manner, high current ion implantation of a substrate can be optimized using a ribbon beam ion implanter.

For other ion implantation applications, it may be preferable to use a spot beam ion beam in which the beam height and beam width are more equal. In many applications the beam height of a spot beam is the same size or somewhat larger than the beam width, and may be on the order of 20 to 30 mm. One advantage afforded by spot beam ion implantation is the better control of dose uniformity afforded by spot beams. In a spot beam ion implantation application, the spot beam may be scanned along a first direction to cover the dimension of a substrate in that direction that is being implanted. At the same time, the substrate may be scanned in a direction perpendicular to that of the scan direction of the spot beam. The local ion dose concentration can be modified by adjusting the speed of the ion beam along the direction of spot beam scanning. This can be accomplished under computer control in a manner that allows the spot beam scanning to be carefully controlled to optimize ion dose uniformity. Often, such spot beam ion implantation does not generate as high a dose rate of ions to the substrate in comparison to ribbon beam ion implantation.

Accordingly, it is common practice for a ribbon beam ion implanter to be employed for certain ion implantation steps or for certain substrates, such as high dose implantation, while a spot beam ion implanter is employed for other ion implantation steps that require better dose control. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a system for dual mode operation in an ion implanter may include a movable beam blocker to adjust beam width of an ion beam in a first direction perpendicular to a first local direction of propagation of the ion beam. The system may further include a scanner to scan the ion beam in a second direction perpendicular to a second local direction of propagation of the ion beam when in a first state and to transmit the ion beam unperturbed in a second state; and mode selector to send a set of signals to the movable beam blocker and to the scanner in order to adjust the width of the ion beam and state of the scanner in concert.

In another embodiment, a method of operating an ion implanter includes receiving input to change a mode of operation of the ion implanter; sending a first signal to a movable beam blocker to adjust an aperture width to transmit an ion beam; and sending a second signal in concert with the first signal to a scanner to change between a first state and a second state, wherein in a first state the scanner is configured to scan the ion beam and in a second state the scanner is configured to transmit the ion beam unperturbed.

DETAILED DESCRIPTION

Figure 1:
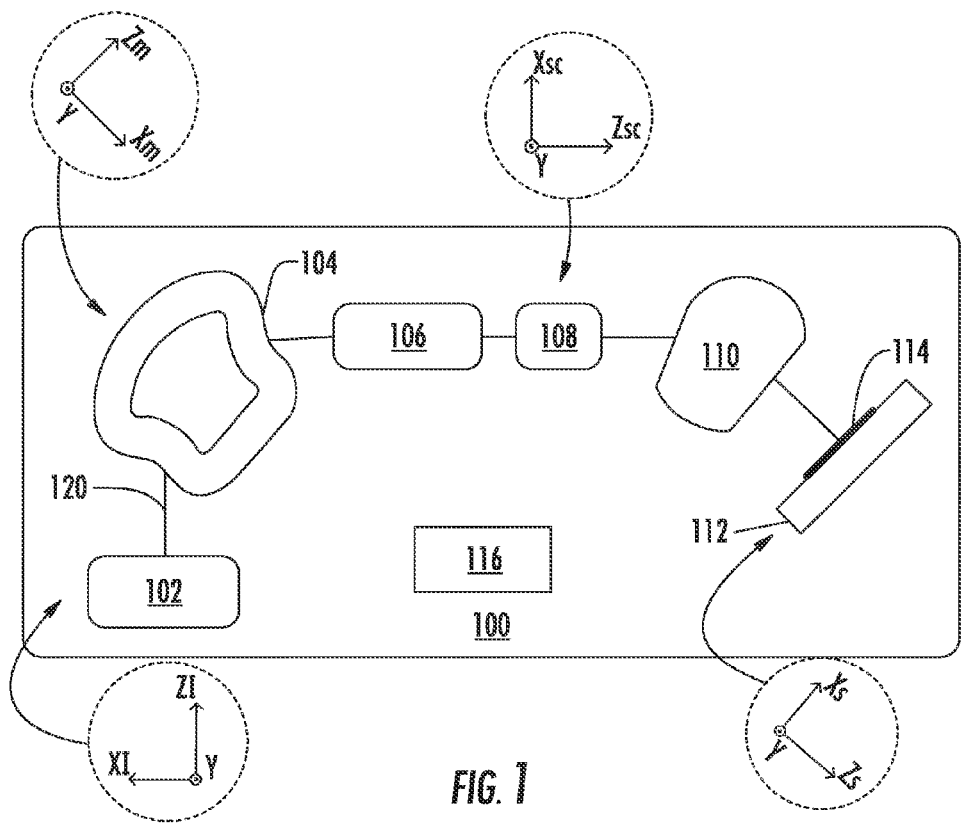
FIG. 1 depicts a top plan view in block form of a dual mode ion implanter according to the present embodiments.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

The embodiments described herein provide novel components to perform dual mode ion implantation and novel ion implantation systems referred to herein as "ion implanters." The components disclosed herein facilitate the ability for an ion implanter to reversibly switch from a ribbon beam implantation mode to a spot beam implantation mode. FIG. 1 depicts a top plan view in block form of a dual mode ion implanter 100 according to the present embodiments. The dual mode ion implanter 100 includes an ion source 102 used to generate ions, an analyzer magnet 104, vacuum chamber 106, scanner 108, a collimator 110, and substrate stage 112. The dual mode ion implanter 100 is configured to generate an ion beam 120 and deliver the ion beam 120 to a substrate 114. For simplicity, the ion beam 120 is depicted merely as a central ray trajectory of the ion beam. In various embodiments, the ion source 102 may be an indirectly heated cathode (IHC) ion source, an RF ion source, a microwave ion source or other ion source. The analyzer magnet 104 may alter the trajectory of ions extracted from the ion source 102 as in conventional analyzer magnets. The vacuum chamber 106 may include a mass resolving slit (not shown in FIG. 1) which may function as a conventional mass resolving slit to screen out ions of undesired mass. In various embodiments the scanner 108 may be an electrostatic scanner or a magnetic scanner, and may include multiple components or stages. The collimator 110 may be a magnetic collimator to function at least to generate a collimated ion beam to be conducted to the substrate 114. The dual mode ion implanter 100 may include other beamline components including apertures, dithering components, acceleration/deceleration components, each of whose operation is well known. For clarity, further discussion of such components is omitted herein.

As further illustrated in FIG. 1, the dual mode ion implanter 100 includes a mode selector 116 whose function is to select the ion implantation mode for operating the dual mode ion implanter 100. Further details of operation of the mode selector 116 are disclosed with respect to the figures to follow. However, in brief, the mode selector 116 may send signals to various components of the ion implanter to produce a desired implantation mode, which may be a spot beam mode or ribbon beam mode. The mode selector 116 may comprise one or more hardware elements as well as software elements, such as switches, circuits, power supplies, computer programs or routines, user interfaces, and the like. In some embodiments, the mode selector may allow a user to interact with the dual mode ion implanter 100 to switch between implantation modes through a user interface such as a mechanical switch, keypad, electronic display, mouse, or other indicating device in a manner that does not require other user intervention to change implantation modes. Thus, an operator of the dual mode ion implanter 100 may change implantation modes by manipulating components that may be located on control panels or equipment used to set other parameters of the dual mode ion implanter 100.

For convenience in the discussion to follow, different coordinate systems are employed to describe operation of the present embodiments as shown in FIG. 1. At the ion source 102, a first Cartesian coordinate system whose components are labeled Y, $X_1$, and $Z_1$, are used, while at the analyzer magnet a second Cartesian coordinate system whose components are labeled Y, Xm, and Zm, is used. At the scanner 108 a third Cartesian coordinate system whose components are labeled Y, Xsc, and Zsc, is used. At the substrate 114 a fourth Cartesian coordinate system whose components are labeled Y, Xs, and Zs, is used. In each coordinate system, the Y-axis is the same absolute direction. The "Z-axis" for the different coordinate systems is in each case along the direction of central ray trajectory of ion beam at a particular point. Thus, the absolute direction of the $Z_1$ axis differs from that of Zm, Zsc and Zs which may be referred to collectively as the Z axes or non-specifically as the Z axis to denote any one of the Z axes. The Z-axis thus represents a direction that is parallel to the local direction of propagation at any point in the dual mode ion implanter 100. Similarly $X_1$ differs from Xm, Xsc and Xs, which are referred to collectively as the "X axes" or non-specifically as the X-axis to denote any one of the X axes.

Because the dual mode ion implanter 100 may operate in either ribbon beam mode or spot beam mode, the dual mode ion implanter 100 provides convenience and process flexibility for processing substrates when a succession of implantation operations for a set of substrates or for different sets of substrates may require different implantation modes. This avoids the requirement to direct substrates to be processed by ribbon beam ion implantation or spot beam ion implantation to a respective ion implanter dedicated for ribbon beam or spot beam implantation.

Figure 2:
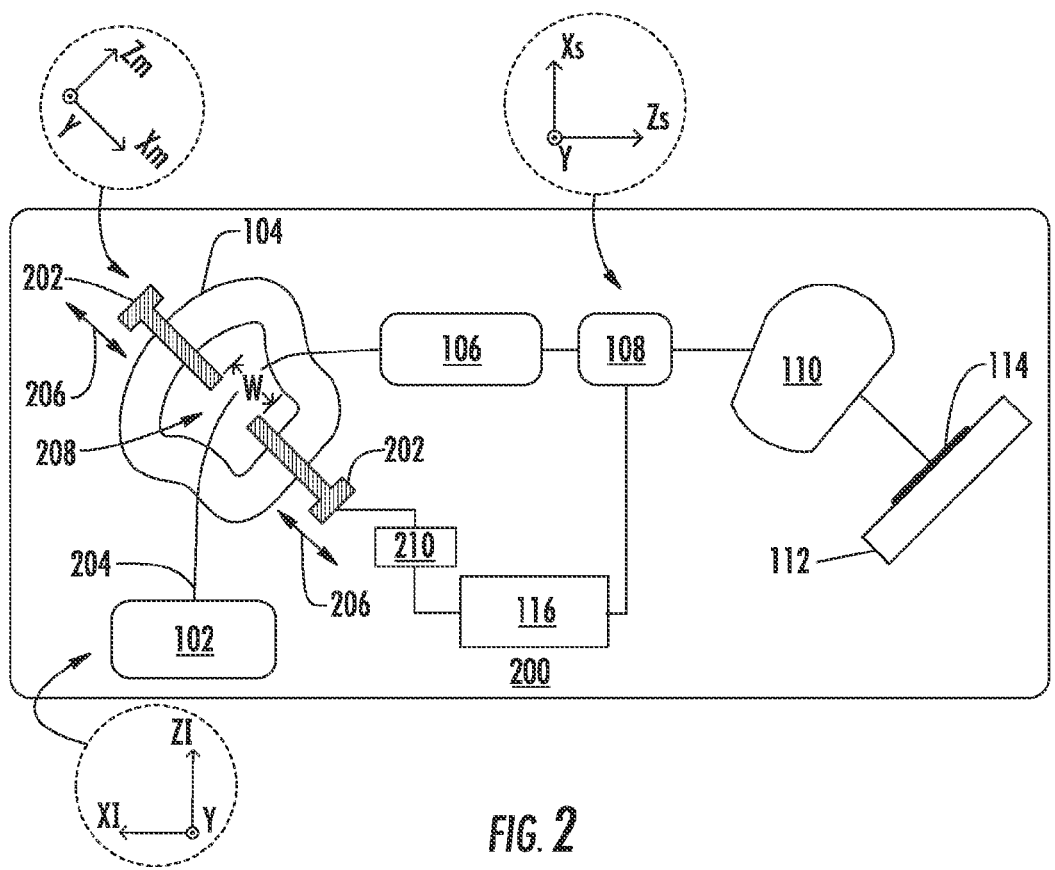
FIG. 2 depicts a plan view of a dual mode ion implanter consistent with further embodiments.

FIG. 2 depicts a plan view of a dual mode ion implanter 200 consistent with further embodiments. The dual mode ion implanter 200 includes those beamline components discussed above with respect to the dual mode ion implanter 100. As illustrated in FIG. 2 the dual mode ion implanter 200 includes a movable beam blocker 202 whose function is to adjust the type of ion beam produced downstream of the movable beam blocker 202 between a ribbon beam and spot beam. In various embodiments, a movable beam blocker may be located in different regions of a beamline. However, in the embodiment of FIG. 2, the movable beam blocker is disposed within the analyzer magnet 104. The movable beam blocker 202 contains a material that blocks ions of the ion beam 204 when those ions strike the movable beam blocker 202. In various embodiments, the movable beam blocker 202 may be a single part or may be multiple parts. The movable beam blocker 202 may contain two separate fingers or may contain separate portions that together define an aperture or window whose size may vary when the movable beam blocker 202 is moved.

In the illustration of FIG. 2, the movable beam blocker 202 includes separate portions that are movable along the axis 206 that is parallel to the Xm axis shown. In order to increase or decrease the aperture width W of an opening between the different portions of movable beam blocker 202 the different portions may be moved in mutually opposite directions.

Although not specifically shown in FIG. 2, in various embodiments the ion source 102 may be configured to generate a ribbon beam that enters the analyzer magnet 104. In various embodiments, the ribbon beam may have a relatively smaller larger beam width along a direction parallel to the X axis as compared to a spot beam. The ribbon beam may have a relatively smaller aspect ratio in comparison to a spot beam, where the aspect ratio is defined by a ratio of ion beam height parallel to the Y axis to ion beam width parallel to the X axis, where the X-Y plane defines a plane that is perpendicular to the direction of propagation of the ion beam at any given point in the dual mode ion implanter 200. For a ribbon beam this aspect ratio may be less than one third (⅓) and is some examples less than one tenth. For example, a ribbon beam provided to the substrate 114 whose ions have trajectories along the Zs axis may have a width along the Xs axis of about 300 to 400 mm and a height along the Y axis of about 20 mm at the substrate 114. The embodiments are not limited in this context.

In order to operate in the ribbon beam mode, the movable beam blocker 202 may be set to establish an aperture width W of an opening 208 between the different portions that accommodates the ribbon beam. In order to operate in a spot beam mode, on the other hand, the movable beam blocker 202 may be set to establish an aperture width W that is smaller than in ribbon beam mode wherein at least a portion of the ribbon beam entering the analyzer magnet 104 is blocked. In various embodiments, the spot beam may have a relatively larger aspect ratio such as greater than ½ and in some cases greater than one. For example, a spot beam provided to the substrate 114 may have a width along the Xs axis of about 20 mm and a height along the Y axis of about 30 mm. The embodiments are not limited in this context. It is to be noted that the aforementioned spot beam dimensions apply to the instantaneous dimension of a spot beam, and that the overall treatment area of a scanned spot beam may be the same or similar to that of a ribbon beam.

In one example, when the operating mode of the dual mode ion implanter 200 is to be changed, the mode selector 116 may generate a signal to an actuator 210, which may include a motor, drive train or other mechanism that is responsive to the signal from the mode selector 116 and configured to move the movable beam blocker 202 from its current position for a current operating mode to a second position to generate the other operating mode. It is to be noted that in some embodiments, that movement of the movable beam blocker 202 may merely change width of an ion beam that passes through the movable beam blocker 202 without affecting height of the ion beam. Thus, in one example, an ion beam having a 150 mm width and 30 mm height may pass through a movable beam blocker 202 when set at a first position. An ion beam having a 20 mm width and 30 mm height may be transmitted through the movable beam blocker 202 when the movable beam blocker is set at a second position.

As further shown in FIG. 2 the mode selector 116 is coupled to the scanner 108, which is disposed downstream of the movable beam blocker 202. In order to establish the spot beam mode the mode selector 116 may send a signal to the movable beam blocker 202 to block a portion of a ribbon beam entering the analyzer magnet 104, thereby defining the ion beam 204 as a spot beam that propagates toward the substrate 114. At the same time the mode selector 116 may send a signal to place the scanner 108 in first state, such as an active state, that is, to activate operation of the scanner 108. When the ion beam 204 enters the scanner 108 as a spot beam, the scanner 108 may scan the spot beam along the axis Xsc so that the ion beam 204 fans out along the Xsc axis as it enters the collimator 110, thereby forming a scanned spot beam that may form a treatment area on the substrate 114 that is similar to that provided by a ribbon beam.

In order to establish the ribbon beam mode the mode selector 116 may send a signal to the movable beam blocker 202 so that the aperture width W of the opening 208 is larger than that in spot beam mode. In some cases the aperture width W may be set to transmit the entire ribbon beam entering the analyzer magnet 104 without blocking any of the ribbon beam, thereby defining the ion beam 204 as a ribbon beam that may propagate to the substrate 114 in a manner as if the movable beam blocker 202 were not present. At the same time the mode selector 116 may send a signal to place the scanner 108 in a second state. The second state may be an inactive state in which operation of the scanner 108 is deactivated. When the ion beam 204 enters a portion of the beamline where the scanner 108 is located, the ribbon beam may propagate through the scanner 108 and to the substrate 114 unperturbed since the scanner 108 is not active.

It is to be noted that the mode selector 116 may switch operating mode from ribbon beam mode to spot mode responsive to user input, such as through a selection or commands entered at a user interface in a control device. In this manner, a user or operator need not perform any manual mechanical equipment adjustments, replacement or removal in the dual mode ion implanter 200 in order to change the operation mode.

Figure 3:
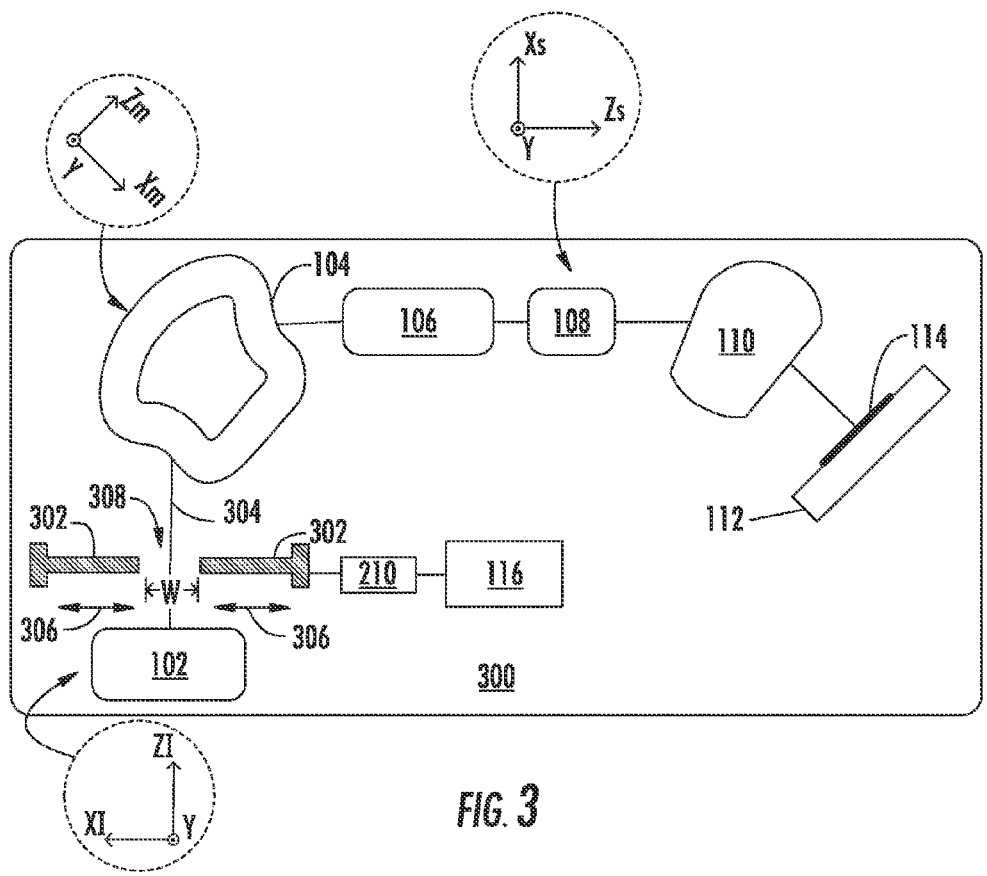
FIG. 3 depicts another embodiment of a dual mode ion implanter in which a movable beam blocker is located at the ion source.

In other embodiments of a dual mode ion implanter, a movable beam blocker may be placed at other locations within the beamline. FIG. 3 depicts one such embodiment of a dual mode ion implanter in which a movable beam blocker 302 is located at the ion source 102 by positioning it just outside an arc chamber of the ion source 102. For instance, the movable beam blocker 302 may be located in an extraction system (not separately shown) which is used to extract the ion beam 304, e.g., proximate an extraction plate of the arc chamber as indicated in FIG. 3. Alternatively, the moveable beam blocker 302 may be positioned inside the arc chamber of the ion source 102. In either variant the movable beam blocker 302 is configured to adjust the aperture width W of the opening 308 along the $X_1$ axis. In this manner, the width of the ion beam 304 may be adjusted to produce either a spot beam or ribbon beam that is incident upon the analyzer magnet 104.

Figure 4A:
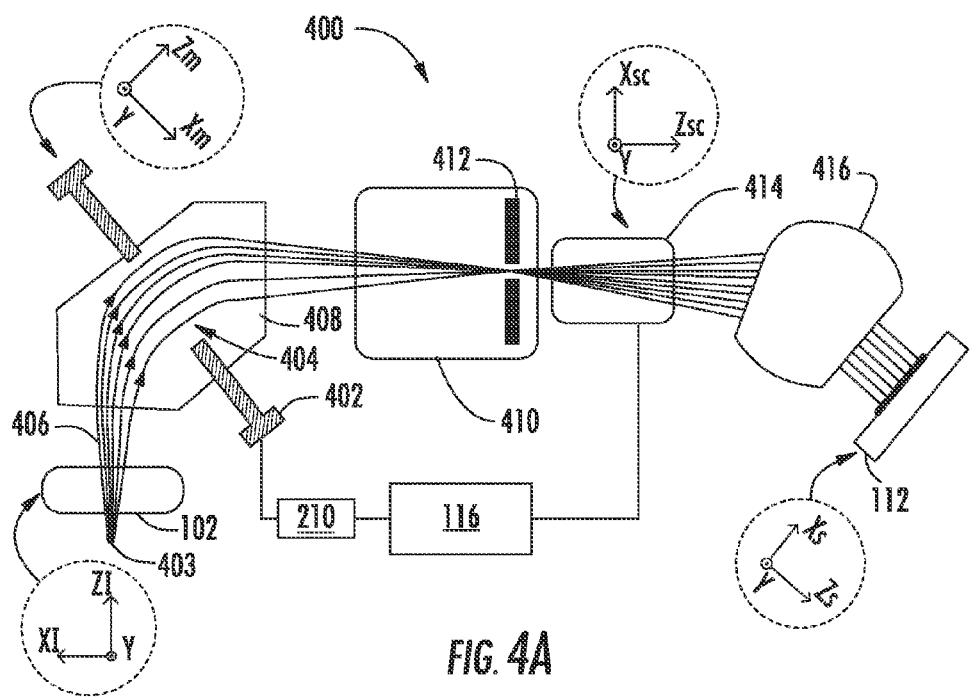
FIGS. 4A and 4B depict details of the geometry of dual mode operation for another ion implanter in accordance with further embodiments of the disclosure.
Figure 4B:
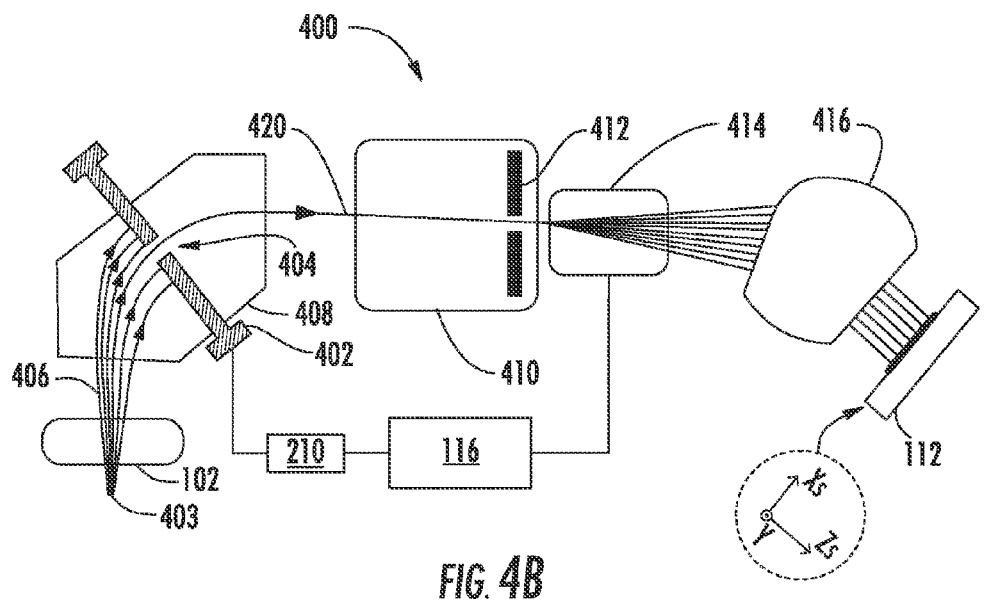

FIGS. 4A and 4B depict details of the geometry of dual mode operation for another dual mode ion implanter 400 in accordance with embodiments of the disclosure. The dual mode ion implanter 400 is configured similarly to dual mode ion implanter 200 in that a movable beam blocker 402 is disposed within an analyzer magnet 408. The movable beam blocker 402 is configured to adjust the aperture width W (not shown for clarity, but see FIG. 2) of the opening 404 defined by the movable beam blocker 402 in a manner described above with respect to the movable beam blocker 202 of FIG. 2. In the scenario depicted in FIG. 4A, the movable beam blocker 402 is disposed in an "open position" in which the aperture width of the opening 404 is relatively larger so that an ion beam 406 propagates as a ribbon beam through the analyzer magnet 408 without obstruction. In the scenario of FIG. 4A, as in conventional ribbon beam architecture, ions may be extracted out of the ion source 102 over a range of trajectories that appear to emanate from a virtual point source 403. The ions are deflected through the analyzer magnet 408 through different trajectories, reaching a maximum width within the analyzer magnet 408 and propagating to a focus within the vacuum chamber 410. In some embodiments, the movable beam blocker 402 is disposed within a central region of the analyzer magnet 408 where the ion beam 406 attains its maximum width along the Xm axis. The ion beam 406 thereafter is focused within the vacuum chamber 410 and narrows at the mass analysis slit 412. The ion beam 406 then propagates through a scanner 414, which is inactive, and fans out before entering the magnetic collimator 416 and propagating to a substrate (not shown). It may be appreciated that in the scenario of FIG. 4A, the dual mode ion implanter 400 functions similarly to a conventional beamline ribbon beam ion implanter in that the presence of the movable beam blocker 402 and scanner 414 may have little if any effect on the ion beam 406. Thus, the magnetic collimator 416 may be set to collimate a diverging ion beam that defines a source located at the mass analysis slit 412 as shown in FIG. 4A.

FIG. 4B illustrates a scenario in which the dual mode ion implanter 400 operates in spot beam mode. In this scenario the mode selector 116 may send signals to adjust the movable beam blocker 402 to reduce the aperture width of the opening 404. This blocks many ions of the ion beam 406 from propagating further along the beam path, thereby reducing the beam width along the Xm axis of the ion beam 406, to form a spot beam 420 that exits the analyzer magnet 408.

The spot beam 420 subsequently propagates through the mass analysis slit 412 and through scanner 414. As further shown in FIG. 4B, the mode selector 116 may send a signal to activate the scanner 414 such that the spot beam 420 is deflected through a range of angles to fan out before entering the magnetic collimator 416. In this manner, the spot beam 420 may be scanned to cover the entirety of substrate 114 along the Xs axis.

In summary, the present embodiments provide a dual mode ion implanter that can be switched from ribbon beam mode to spot beam mode. This is accomplished with the use of a movable beam blocker which is adjusted to form either a ribbon beam or spot beam, and a scanner, which is activated when a spot beam is generated. In addition to the footprint and cost savings by incorporating both ribbon beam and spot beam implantation in the same tool, an advantage of the present embodiments is that high current ribbon beam implantation and spot beam implantation can be provided in the same substrate chamber in any desired sequence. Moreover, the movable beam blocker and scanner of the present embodiments may be incorporated into an existing high current ion implanter to add spot beam capability to a ribbon beam tool.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A system for dual mode operation in an ion implanter, comprising:
    a movable beam blocker to adjust beam width of an ion beam in a first direction perpendicular to a first local direction of propagation of the ion beam;
    a scanner to scan the ion beam in a second direction perpendicular to a second local direction of propagation of the ion beam when in a first state and to transmit the ion beam unperturbed in a second state;
    a mode selector to send a set of signals to the movable beam blocker and to the scanner in order to adjust the width of the ion beam and state of the scanner in concert; and
    an analyzer magnet, wherein the movable beam blocker is disposed within the analyzer magnet.

2. The system of claim 1, wherein the movable beam blocker is configured to move between a first position and second position, wherein at the first position the ion beam forms a ribbon beam that has a first aspect ratio defined by a ratio of a first beam height to a first beam width, and at the second position the ion beam forms a spot beam having a second aspect ratio defined by a ratio of a second beam height to a second beam width, wherein the first aspect ratio is less than the second aspect ratio.

3. The system of claim 2, wherein the first aspect ratio is less than 1/3, and wherein the second aspect ratio is greater than 1/2.

4. The system of claim 1, wherein in the mode selector is configured to:
    send a first signal to the movable beam blocker to have a first aperture width configured to transmit a ribbon beam without blocking the ribbon beam, and
    send a second-signal to maintain the scanner in a second state when the movable beam blocker has the first aperture width.

5. The system of claim 1, wherein in the mode selector is configured to:
    send a first signal to the movable beam blocker to have a second aperture width configured to block a portion of a ribbon beam that is incident on the beam blocker, wherein a portion of the ribbon beam is transmitted as a spot beam; and
    send a second signal to scan the spot beam when the movable beam blocker has the second aperture width.

6. An ion implanter, comprising:
    an ion source to generate an ion beam; and
    a movable beam blocker disposed at a first location in the ion implanter and configured to move from a first position to a second position, wherein at the first position the ion beam forms a ribbon beam that has a first beam width and at the second position the ion beam forms a spot beam having a second beam width, wherein the first beam width is greater than the second beam width; and
    an analyzer magnet, wherein the movable beam blocker is disposed within the analyzer magnet.

7. The ion implanter of claim 6 further comprising a scanner disposed downstream of the movable beam blocker, wherein the scanner is configured to scan the ion beam in a direction perpendicular to a direction of propagation of the ion beam when in a first state and is configured to transmit the ion beam unperturbed when in a second state.

8. The ion implanter of claim 7, further comprising a mode selector configured to send signals to the movable beam blocker and scanner in order to adjust beam width of the ion beam and state of the scanner in concert.

9. The ion implanter of claim 6, wherein the ribbon beam comprises a first aspect ratio defined by a ratio of beam height to beam width having a value less than 1/3, and wherein the spot beam has an aspect ratio having a value greater than 1/2.

10. A method of operating an ion implanter, comprising:
    receiving input to change a mode of operation of the ion implanter;
    sending a first signal to a movable beam blocker disposed within an analyzer magnet of the ion implanter to adjust an aperture width to transmit an ion beam; and
    sending a second signal in concert with the first signal to a scanner to change between a first state and second state, wherein in the first state the scanner is configured to scan the ion beam and in the second state the scanner is configured to transmit the ion beam unperturbed.

11. The method of claim 10, wherein the first signal is a signal to the movable beam blocker to increase the aperture width to a first aperture width configured to transmit a ribbon beam without blocking the ribbon beam, and wherein the second signal is a signal to maintain the scanner in the second state when the movable beam blocker has the first aperture width.

12. The method of claim 10, wherein the first signal is a signal to the movable beam blocker to decrease the aperture width to a second aperture width configured to block a portion of a ribbon beam that is incident on the beam blocker, wherein a portion of the ribbon beam is transmitted as a spot beam and wherein the second signal is a signal to maintain the scanner in the first state when the movable beam blocker has the second aperture width.

13. An ion implanter, comprising:
    an ion source to generate an ion beam; and
    a movable beam blocker disposed at a first location within an arc chamber of the ion source and configured to move from a first position to a second position, wherein at the first position the ion beam forms a ribbon beam that has a first beam width and at the second position the ion beam forms a spot beam having a second beam width, wherein the first beam width is greater than the second beam width.

* * * * *